United States Patent [19]
Oosedo et al.

[11] Patent Number: 5,629,127
[45] Date of Patent: May 13, 1997

[54] POSITIVE ELECTRON BEAM RESIST COMPOSITION CONTAINING CRESOLNOVOLAK RESIN, SELECT ADDITIVE AND METHYL GALLATE/1,2-NAPHTHOQUINONEDIAZIDO-4-SULFONYL CHLORIDE REACTION PRODUCT

[75] Inventors: Hiroki Oosedo, Ehime; Mutsuo Kataoka, deceased, late of Shiga; Mayumi Kataoka, legal representative, Otsu; Shigeyoshi Kanetsuki, Shiga; Kazutaka Tamura, Shiga; Masaya Asano, Shiga, all of Japan

[73] Assignee: Toray Industries, Inc., Japan

[21] Appl. No.: 360,806

[22] PCT Filed: Apr. 28, 1994

[86] PCT No.: PCT/JP94/00720

§ 371 Date: May 25, 1995

§ 102(e) Date: May 25, 1995

[87] PCT Pub. No.: WO94/25904

PCT Pub. Date: Nov. 10, 1994

[30] Foreign Application Priority Data

Apr. 28, 1993 [JP] Japan .................... 5-102428

[51] Int. Cl.$^6$ .................. G03F 7/023; G03C 1/61
[52] U.S. Cl. .................. 430/191; 430/192; 430/193; 430/296

[58] Field of Search .................. 430/191, 192, 430/193, 296

[56] References Cited

FOREIGN PATENT DOCUMENTS

| | | |
|---|---|---|
| 63-115162 | 5/1988 | Japan . |
| 2-248954 | 10/1990 | Japan . |
| 3-230164 | 10/1991 | Japan . |
| 3251845 | 11/1991 | Japan . |
| 4012356 | 1/1992 | Japan . |
| 4012357 | 1/1992 | Japan . |
| 4-122938 | 4/1992 | Japan . |
| 4278954 | 10/1992 | Japan . |

*Primary Examiner*—Christopher G. Young
*Attorney, Agent, or Firm*—Austin R. Miller

[57] ABSTRACT

The present invention relates to a positive electron beam resist composition containing a cresolnovolak resin, a lower molecular additive with a specific structure and a quinonediazide compound with a specific structure, and a developer for the positive electron beam resist, containing specific amounts of alkali metal ions, weak acid radical ions and a water soluble organic compound. The present invention can provide a positive electron beam resist composition with a novolak and a quinonediazide as main ingredients, excellent in dry etching resistance and resolution, and it if is used, a fine pattern can be obtained at high sensitivity especially when the developer of the present invention is used.

9 Claims, No Drawings

POSITIVE ELECTRON BEAM RESIST COMPOSITION CONTAINING CRESOLNOVOLAK RESIN, SELECT ADDITIVE AND METHYL GALLATE/1,2-NAPHTHOQUINONEDIAZIDO-4-SULFONYL CHLORIDE REACTION PRODUCT

TECHNICAL FIELD

The present invention relates to a positive electron beam resist composition used for producing masks for photolithography, semiconductor integrated circuits, etc. by using electron beam lithography, and a developer for the positive electron beam resist.

BACKGROUND TECHNIQUES

Conventionally used positive electron beam resists are mainly composed of a polymer such as polymethyl methacrylate, poly(2,2,2-trifluoroethyl α-chloroacrylate) or poly(1-butenesulfone). However, these resists are disadvantageously poor in dry etching resistance. In recent years, dry etching is increasingly used in the production of photomasks, semiconductor integrated circuits, etc., and these conventional resists cannot be used satisfactorily in more cases.

On the contrary, positive photoresists mainly composed of a novolak resin and a quinonediazide compound (e.g., Japanese Patent Laid-Open (Kokai) Nos. 63-115162, 3-251845 and 4-12357) are excellent in dry etching resistance and in addition, can be developed by a non-swelling alkali aqueous solution, hence being excellent in resolution and pattern form advantageously. However, they are unpractically extremely low in sensitivity when used for electron beam lithography.

An object of the present invention is to present a positive electron beam resist composition mainly composed of a novolak resin and a quinonediazide compound, excellent in dry etching resistance and resolution and high in sensitivity.

Another object of the present invention is to present a method for forming a fine pattern specifically high in sensitivity, accurately rectangular in form and higher in resolution by using the positive electron beam resist composition.

DISCLOSURE OF THE INVENTION

The present invention can provide a positive electron beam resist composition mainly composed of a novolak and a quinonediazide excellent in dry etching resistance and resolution, and the composition can be used to obtain a fine pattern at high sensitivity especially if the developer of the present invention is used.

THE BEST EMBODIMENT FOR EXECUTION OF THE INVENTION

The inventors studied the resists mainly composed of a novolak resin and a quinonediazide compound, and the processes for them, and as a result, found that if a resist optimized in material and composition is developed by a developer with a specific composition, high sensitivity not achieved by applying any of the conventional photoresists can be achieved.

The positive electron beam resist composition of the present invention comprises (1) a cresolnovolak resin, (2) at least one additive selected from a group consisting of compounds represented by the following general formulae (I) and (II):

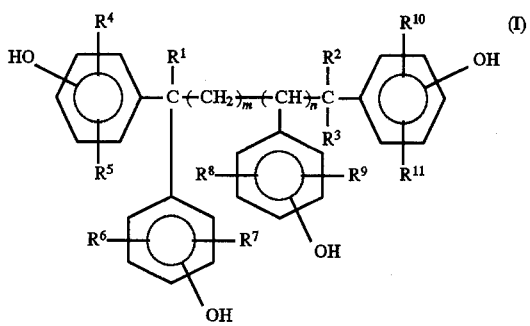

(where $R^1$, $R^2$ and $R^3$ independently represent a hydrogen atom, an alkyl group, an aralkyl group or an aryl $R^4$, $R^5$, $R^6$, $R^7$, $R^8$, $R^9$, $R^{10}$ and $R^{11}$ independently represent a hydrogen atom, a halogen atom, a hydroxyl group and an alkyl group; m is an integer from 0 to 3; and n is an integer from 0 to 1.)

(where X stands for

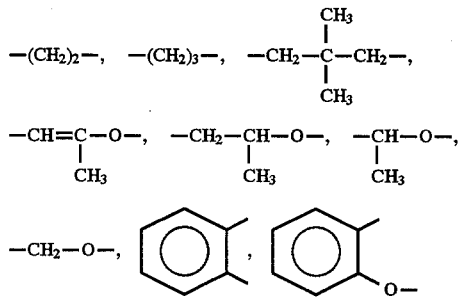

and R stands for an alkyl group or aralkyl group.) and (3) the quinonediazide compound obtained by letting methyl gallate and 1,2-naphthoquinonediazido-4-sulfonyl chloride react with each other, as main ingredients, where the amount of the additive (2) is 5 to 20 wt % based on the weight of the resist solid; the amount of the quinonediazide compound (3) is 10 to 20 wt % based on the weight of the resist solid; and the triester content in the quinonediazide compound (3) is 30 to 55 wt %.

The cresolnovolak resin used in the positive electron beam composition of the present invention can be obtained, for example, by condensing a cresol, preferably a mixture of p-cresol and m-cresol and formaldehyde or paraformaldehyde as a formaldehyde polymer or 1,3,5-trioxane.

The condensation reaction can be effected without any solvent or in an organic solvent. The organic solvent can be preferably selected from alcohols such as methanol, ethanol, 1-propanol, 2-propanol and 1-butanol, cellosolves such as methyl cellosolve, ethyl cellosolve and butyl cellosolve, cellosolve esters such as methyl cellosolve acetate and ethyl cellosolve acetate, ethers such as tetrahydrofuran and 1,4-dioxane, etc.

The catalyst for the condensation reaction can be preferably selected from acids such as oxalic acid, formic acid, hydrochloric acid, sulfuric acid, perchloric acid, phosphoric acid and p-toluenesulfonic acid and metal salts such as zinc acetate and magnesium acetate.

The novolak resin thus obtained generally contains low molecular components such as dinuclear component with two phenols condensed and trinuclear component with three phenols condensed. The low molecular components contain those which cause scum and pattern deformation. If the synthesized novolak contains these low molecular components in a large amount, they should be removed by any proper operation, preferably to keep the total content of dinuclear and trinuclear components at 10 wt % or less.

To remove the low molecular components from the novolak resin, for example, any of the following methods can be used.

(1) Extraction method

The novolak resin is finely ground and stirred with an organic solvent such as benzene, toluene, xylene, chlorobenzene or dichlorobenzene, or water or a mixture consisting of an organic solvent such as ethanol or ethanol and water, at a certain temperature, and the lower molecular components are extracted.

(2) Re-precipitation method

The novolak resin is dissolved into an organic solvent such as methanol, ethanol, acetone or ethyl cellosolve, and a bad solvent such as water, petroleum ether or hexane is added dropwise into the novolak solution, or on the contrary the novolak solution is added dropwise into the bad solvent, for precipitating the novolak resin. The precipitate is then separated and dried.

(3) Separation method

The novolak resin is dissolved into a mixed solvent consisting of an organic solvent miscible with water such as methanol, ethanol, acetone or ethyl cellosolve and an organic solvent immiscible with water such as ethyl cellosolve acetate or propylene glycol monomethyl ether acetate, and water is added dropwise for separation into two layers. The organic layer is then separated and concentrated.

Furthermore, the electron beam resist of the present invention contains at least one selected from a group consisting the compounds represented by the general formulae (I) and (II) as an additive.

Several known techniques use an alkali soluble low molecular compound as an additive for the photoresist, including those stated in Japanese Patent Laid-Open (Kokai) Nos. 1-44439, 1-177032, 2-275955, 3-230164, 3-251845, 4-12357, etc.

However, the resists using any of these additives do not always give good results when used as electron beam resists, as described in detail under "Prior arts". The present invention is based on a finding that the most excellent properties are exhibited when any of the compounds represented by the general formula (I) stated in Japanese Laid-Open (Kokai) No. 4-12357 or any of the compounds represented by the general formula (II) stated in Japanese Patent Laid-Open (Kokai) No. 3-251845 is used with the specific quinonediazide compound described later.

Any one or several as a mixture of these additives can be used. The amount of the additive should be 5 to 20 wt % based on the weight of the resist solid. In this case, the resist solid refers to the balance remaining after removing the solvent from the resist composition. If the amount is less than 5 wt %, the sensitivity is too low, and if more than 20 wt %, the resist pattern is deformed. A preferable range is 10 to 20 wt %.

Examples of the compounds represented by the general formulae (I) and (II) are listed below:

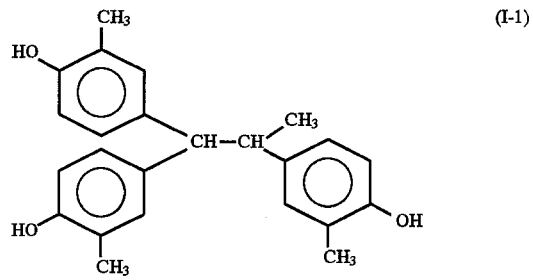

(I-1)

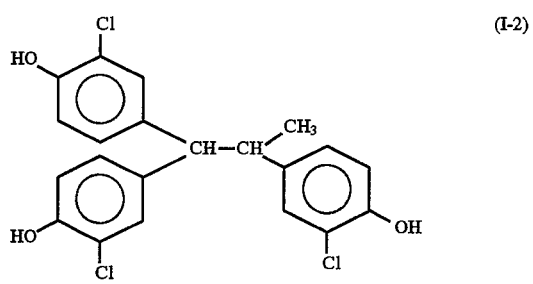

(I-2)

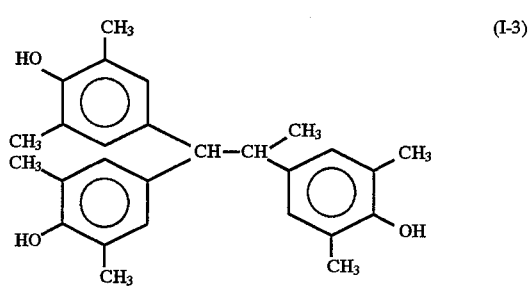

(I-3)

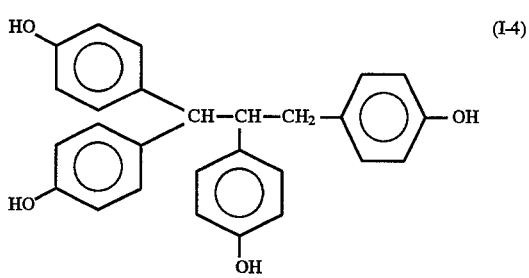

(I-4)

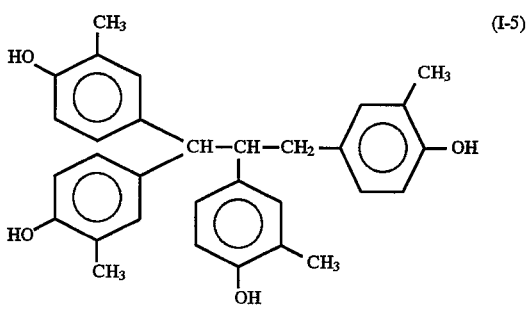

(I-5)

-continued
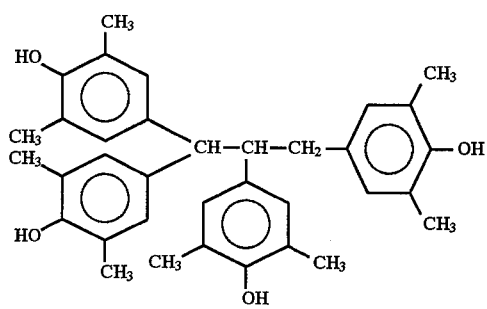
(I-6)
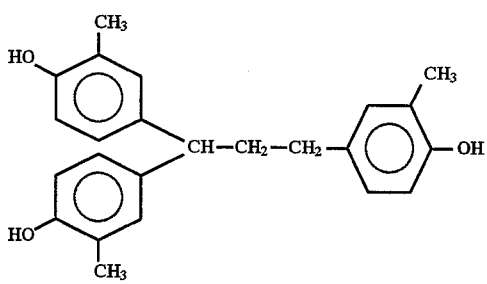
(I-7)
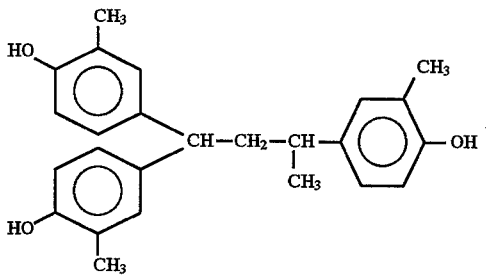
(I-8)
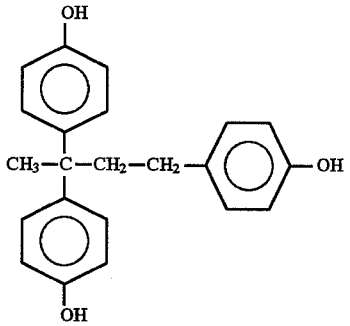
(I-9)
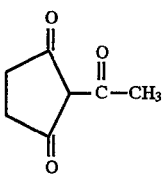
(II-1)
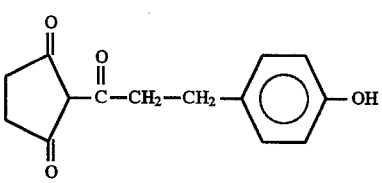
(II-2)
-continued
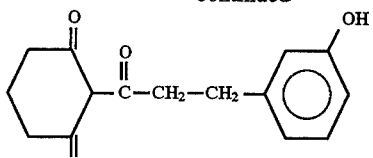
(II-3)
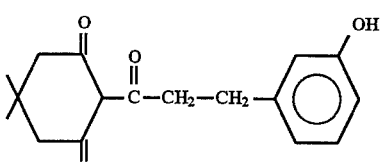
(II-4)
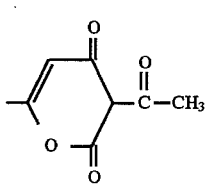
(II-5)
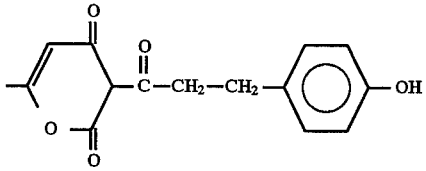
(II-6)
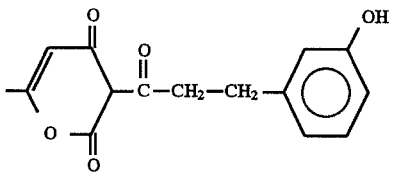
(II-7)
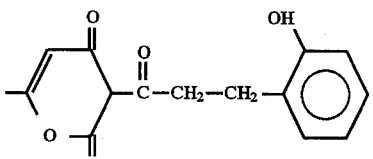
(II-8)
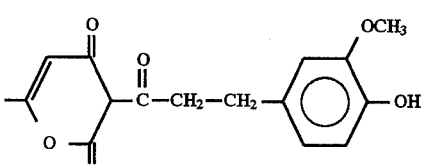
(II-9)
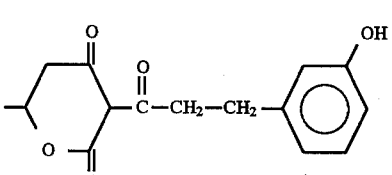
(II-10)
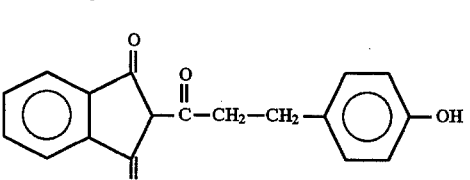
(II-11)

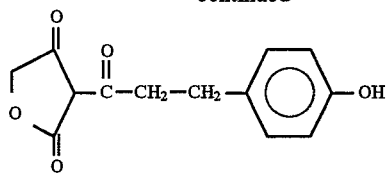

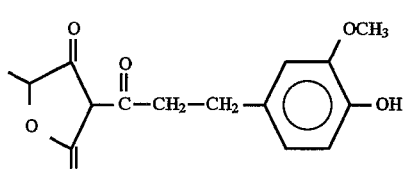

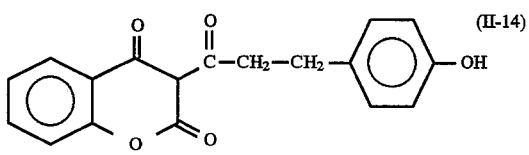

Especially preferable compounds among these additives are those represented by the general formula (I) where m stands for 0 or 1, more preferably where m stands for 0 while n stands for 0. Furthermore, compounds with halogen atoms and/or alkyl groups, particularly chlorine atoms and/or methyl groups as $R^4$ to $R^{11}$ are preferable. Those with the OH groups in the formula (I) at the p-position are also preferable.

The electron beam resist of the present invention contains the quinonediazide compound obtained by reaction between methyl gallate and 1,2-naphthoquinonediazido-4-sulfonyl chloride as an ingredient sensitive to the electron beam.

The quinonediazide compound obtained like this is generally a mixture consisting of a monoester with one hydrogen atom of the hydroxyl groups of methyl gallate substituted by a 1,2-naphthoquinonediazido-sulfonyl group, a diester with two hydrogen atoms of the hydroxyl groups substituted by 1,2-naphthoquinonediazido-sulfonyl groups and a triester with all of the three hydrogen atoms of the hydroxyl groups substituted by 1,2-naphthoquinonediazido-sulfonyl groups. In this mixture, the amount of the triester must be 30 to less than 55 wt %, preferably 40 to 50 wt % based on the total amount of the quinonediazide compound. If the amount of the triester is more than the range, the sensitivity is too low, and if smaller than the range, the film thickness after development is decreased more in the non-exposed portion, to deform the pattern. The amount of all the quinonediazide compound should be 10 to 20 wt %, preferably 15 to 20 wt % based on the weight of the resist solid. If the amount is more than 20 wt %, the sensitivity is too low, and if less than 10 wt %, the film thickness is remarkably decreased.

This quinonediazide compound is known as a sensitive material for photoresists, but Japanese Patent Publication (Koho) No. 54-20330 reports that it is not practical for photoresists since the film remaining rate after completion of development is too large. As an improvement, Japanese Patent Laid-Open (Kokai) No. 63-115162 states that if the amount of the triester is kept at 0.4 wt % or more and the amount of the quinonediazide compound conforms to the following conditions, then the photoresist obtained becomes good in performance.

If $0.4 \leq x < 0.6$
then $A/B \geq 0.8-x$
If $0.6 \leq x 0.8$
then $A/B \geq 0.5-0.5x$
If $0.8 \leq x \leq 1.0$
then $A/B \geq 0.18-0.1x$ (where x is the weight ratio of the triester in the sensitive material, and A/B is the ratio by weight of the sensitive material to the alkali soluble resin.)

However, this composition range does not agree with the range used in the electron beam resist of thee present invention at all, and it can be seen that the composition preferable as a photoresist is greatly different from the composition preferable as an electron beam resist.

The resist composition of the present invention can have such additives as a surfactant and antioxidant added properly in addition to the above main ingredients.

The resist composition of the present invention can be obtained by dissolving the above ingredients into a solvent. The amount of the solvent used is not especially determined, but should be adjusted to keep the resist solid content in a range from 10 to 35 wt % of the resist composition. The solvent can be preferably selected from esters such as ethyl acetate, butyl acetate, amyl acetate, methyl propionate, ethyl propionate, methyl butyrate, ethyl butyrate, methyl benzoate, methyl lactate and ethyl lactate, cellosolves such as methyl cellosolve, ethyl cellosolve and butyl cellosolve, cellosolve esters such as methyl cellosolve acetate, ethyl cellosolve acetate and butyl cellosolve acetate, propylene glycol ether esters such as propylene glycol monomethyl ether acetate and propylene glycol monoethyl ether acetate, ethers such as 1,2-dimethoxyethane, 1,2-diethoxyethane, tetrahydrofuran, 1,4-dioxane and anisole, ketones such as methyl ethyl ketone, methyl isobutyl ketone, cyclohexanone and isophorone, amides such as dimethylformamide, dimethylacetamide and N-methylpyrrolidone, aprotic polar solvents such as dimethyl sulfoxide and sulfolane, and their mixtures.

The electron beam resist of the resent invention is applied onto a substrate, dried, exposed to an electron beam with a pattern, and developed, to form a fine pattern.

The coating, drying and exposure can be effected according to any of the conventional methods used for forming an electron beam resist pattern. For example, a spinner, etc. is used for coating to form a film of about 0.5 to 2.0 μm in dry thickness, and the film is dried. For exposure, an ordinary electron beam exposure apparatus can be used.

In general, a resist mainly composed of a novolak resin and a quinonediazide compound can be developed by using an aqueous solution containing one or more of inorganic alkalis such as hydroxides, carbonates, phosphates, silicates and borates of alkali metals, amines such as 2-diethylaminoethanol, monoethanolamine and diethanolamine, quaternary ammonium hydroxides such as tetraethylammonium hydroxide and choline.

In the case of photoresists, variously composed developers as described above can be used, and they can also be applied to the electron beam resist of the present invention. However, if a developer composed as stated below is used to develop the electron beam resist of the present invention, uniform development can be achieved at high sensitivity, high resolution in good pattern form without any development residue.

The developer is a developer for positive electron beam resists, comprising alkali metal ions, weak acid radical ions and a water soluble organic compound subject to the following conditions: $0.05 \leq a \leq 0.5$, $0.07 \leq bn \leq 1.5$ and $a < bn$ or $a > bn$, wherein a is the concentration of the alkali metal in mol/kg, b is the concentration of the weak acid radical in mol/kg and n is the valence of the weak acid radical ions, the concentration of the water soluble organic compound, being 0.5 to 10 wt %.

The alkali metal is generally sodium or potassium. The concentration, a, of the alkali metal (the total concentration of the ionized metal and the salt) should be preferably 0.05 to 0.5 mol/kg, more preferably 0.08 to 0.4 mol/kg. If the concentration of the alkali metal is too high, the film thickness after development is decreased greatly, and no pattern can be obtained. If too low, the pattern portion to be dissolved is not dissolved, and no pattern can be obtained either.

The weak acid radical can be selected from carbonic acid radical ($CO_3^{2-}$), silicic acid radical ($SiO_3^{2-}$), phosphoric acid radical ($PO_4^{3-}$), boric acid radical ($BO_3^{3-}$), etc. Among them, boric acid radical is most preferable. The product, bn, of the concentration, b, of the weak acid-radical (the total concentration of the ionized radical and the salt) and the valence, n, of the weak acid radical ions should be preferably 0.075 to 1.5 mol/kg, more preferably 0.15 to 0.9 mol/kg. If the concentration of the weak acid radical is too high, the dissolving rate is too low to allow development, and if the concentration is too low, the solubility becomes irregular, not to allow the pattern to be obtained. For example, if two or more kinds of anions such as $CO_3^{2-}$ and $HCO_3^-$ exist in case of carbonic acid, the value of b should be obtained assuming the most dissociated state ($CO_3^{2-}$ in this case), and therefore the value of n should also be assumed to be the value in the most dissociated state (2 in this case), for obtaining the product, bn.

The relation between the concentration, a, of the alkali metal and the product, bn should be preferably a<bn or a>bn. For effective exhibition of buffer action, a<bn is preferable. The developer can also be used even at a=bn, but it is inferior in buffer action.

The developer satisfying the above requirements can be prepared by, but not limited to, dissolving predetermined amounts of an alkali metal hydroxide and a weak acid into water, or dissolving predetermined amounts of an alkali metal hydroxide and a weak acid salt of the alkali metal into water.

The most preferable developer contains potassium ions and boric acid radical ions, and in this case, specifically high sensitivity can be obtained. In addition, if the developer is used, the pattern form is accurately rectangular and the resolution is also high advantageously. In this case, it is preferable that the molar ratio of potassium atoms to boron atoms in the developer is 100:50 to 100:100, more preferably 100: 60 to 100:70. The preferable concentration of the developer depends on the developing machine, temperature and resist composition, but it is generally preferable that the amount of potassium atoms contained per 1 kg of he developer is in a range from 0.05 to 0.50 mole. The developer can be prepared not only from potassium hydroxide and potassium borate, but also from a corresponding amount of potassium hydroxide and boric acid.

The developer contains a water soluble organic compound. The water soluble organic compound contained in the developer can present such effects as more uniform solubility, higher sensitivity and freedom from development residue.

The water soluble organic compound can be one or more selected from, but not limited to, the compounds represented by the following general formulae (I), (II), (III), (IV) and (V), dimethyl sulfoxide, acetonitrile, pyridine, morpholine, etc.

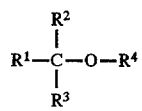

(where $R^1$, $R^2$, $R^3$ and $R^4$ stand for, respectively independently, one selected form a group consisting of hydrogen atom, alkyl group and hydroxyalkyl group; $R^1$ and $R^4$ may also be combined to form a closed ring; and the number of carbon atoms of this compound is 1 to 6.)

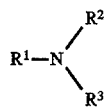

(where $R^1$, $R^2$ and $R^3$ stand for, respectively independently, one selected from a group consisting of hydrogen atom, alkyl group and hydroxyalkyl group; $R^1$ and $R^3$ may also be combined to form a closed ring; and the number of carbon atoms of this compound is 1 to 9.)

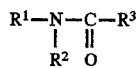

(where $R^1$, $R^2$ and $R^3$ stand for, respectively independently, one selected from a group consisting of hydrogen atom, alkyl group and hydroxyalkyl group; $R^1$ and $R^3$ may also be combined to form a closed ring; and the number of carbon atoms of this compound is 1 to 9.)

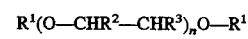

(where $R^1$, $R^2$, $R^3$ and $R^4$ stand for, respectively independently, one selected from a group consisting of hydrogen atom, alkyl group and hydroxyalkyl group; $R^1$ and $R^4$ may also be combined to form a closed ring; n stands for 1 to 10; and the number of carbon atoms of this compound is 2 to 20.)

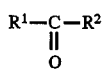

(where $R^1$ and $R^2$ stand for, respectively independently, one selected from a group consisting of alkyl group, hydroxyalkyl group and phenyl group with hydroxy group; and the number of carbon atoms of this compound is 3 to 14.)

The compounds represented by general formula (I) include, but not limited to, methanol, ethanol, n-propanol, isopropanol, n-butanol, 2-methyl-1-propanol, 2-methyl-2-propanol, n-pentanol, 2-methyl-1-butanol, 2-methyl-2-butanol, 3-methyl-1-butanol, 3-methyl-2-butanol, 2,2-dimethyl-1-propanol, n-hexanol, cyclohexanol, 2,2-dimethyl-1,3-propanediol, glycerol, tetrahydrofuran, etc.

The compounds represented by general formula (II) include, but not limited to, diethylamine, triethylamine, propylamine, dipropylamine, isopropylamine, diisopropylamine, monoethanolamine, diethanolamine, triethanolamine, ethylethanolamine, methylethanolamine, ethyldiethanolamine, methyldiethanolamine, diethylaminoethanol, dimethylaminoethanol, propanolamine, isopropanolamine, methylpropanolamine, methylisopropanolamine, dimethylpropanolamine, dimethylisopropanolamine, ethylpropanolamine, ethylisopropanolamine, diethylpropanolamine, diethylisopropanolamine, dibutylaminoethanol, pyrrolidine, pyrrole, etc.

The compounds represented by general formula (III) include, but not limited to, dimethylformamide, acetamide, N-methylacetamide, N,N-dimethylacetamide, N-ethylacetamide, N,N-diethylacetamide, pyrrolidone, N-methylpyrrolidone, N-vinylpyrrolidone, 3-pyrrolidino-1, 2-propanediol, valerolactam, caprolactam, etc.

The compounds represented by general formula (IV) include, but not limited to, ethylene glycol, diethylene glycol, triethylene glycol, propylene glycol, ethylene glycol monomethyl ether, ethylene glycol monoethyl ether, ethylene glycol monobutyl ether, ethylene glycol monoisopropyl ether, diethylene glycol monomethyl ether, diethylene glycol monoethyl ether, diethylene glycol monobutyl ether, triethylene glycol monomethyl ether, triethylene glycol monoethyl ether, triethylene glycol monobutyl ether, ethylene glycol dimethyl ether, ethylene glycol diethyl ether, ethylene glycol dibutyl ether, diethylene glycol dimethyl ether, diethylene glycol diethyl ether, diethylene glycol dibutyl ether, triethylene glycol dimethyl ether, triethylene glycol diethyl ether, triethylene glycol dibutyl ether, propylene glycol monomethyl ether, propylene glycol dimethyl ether, polyethylene glycol, 1,4-dioxane, etc.

The compounds represented by general formula (V) include, but not limited to, acetone, methyl ethyl ketone, 4-hydroxy-4-methyl-2-pentanone, etc.

Preferable water soluble organic compounds are dimethyl sulfoxide and the compounds represented by general formulae (I), (II), (III) and (IV), particularly 2-diethylaminoethanol, dimethylaminoethanol, diethanolamine, monoethanolamine, tetrahydrofuran, ethanol, ethylene glycol, propylene glycol, dimethyl sulfoxide, N-methylpyrrolidone, etc.

The amount of the water soluble organic compound added should be preferably in a range from 0.5 to 10 wt %. If the amount of the water soluble organic compound added is too large, the film thickness after, development is decreased greatly to result in poor resolution, and if too small, film roughening and development residue are liable to occur.

The developer containing such an inorganic salt is high in interfacial tension, and hence poor in wettability and liable to cause uneven development. So, it is preferable to add any proper surfactant. The surfactant added greatly affects the performance of the developer. For example, a-quaternary ammonium salt surfactant or polyoxyethylene surfactant often remarkably lowers the sensitivity. For the developer used in the present invention, it is preferable to use an acetylene alcohol surfactant or sulfonate surfactant, since they do not adversely affect the performance. The amount of the surfactant added should be preferably 30 to 300 ppm based on the amount of the developer.

The present invention is described below more concretely in reference to examples.

EXAMPLE 1

(1) Preparation of novolak

A novolak resin was obtained according to an ordinary method, using 35 parts of m-cresol, 65 parts of p-cresol, 0.5 part of oxalic acid and 46 parts of 37% formalin.

By gel permeation chromatography, the novolak was found to be 6650 in weight average molecular weight (in terms of polyethylene oxide), 1184 in number average molecular weight, 5.62 in molecular weight dispersion, 10.5 wt % in dinuclear component content and 5.7 wt % in trinuclear component content.

One part of the novolak was dissolved into 5.00 parts of methanol, and with stirring, 4.00 parts of water were added dropwise, to precipitate the novolak. The supernatant solution was removed, and the precipitated novolak was taken out and dried in vacuum at 50° C. for 24 hours. The amount of the novolak obtained was 0.86 part. The novolak was found to be 7,259 in weight average molecular weight, 1,745 in number average molecular weight, 4.16 in molecular weight dispersion, 6.1 wt % in dinuclear component content and 3.0 wt % in trinuclear component content.

(2) Preparation of quinonediazide compound

Fifteen point zero grams (81 mmol) of methyl gallate and 41.0 g (153 mmol) of 1,2-naphthoquinonediazido-4-sulfonyl chloride were dissolved into 220cm$^3$ of dioxane, and the solution was heated to 40° C. Then, a solution with 15.4 g (153 mmol) of triethylamine dissolved in 65 cm$^3$ of dioxane was added dropwise, and the mixture was stirred for 5.5 hours. The reaction mixture was poured into water, and the precipitate formed was secured by filtration, washed by water, washed by methanol and dried, to obtain 41.0 g of a yellow powder. By high performance liquid chromatography, the triester content was found to be 48%.

(3) Preparation of resist composition

The following raw materials were mixed, to prepare a resist solution. In the following description, "parts" means "parts by weight".

| | |
|---|---|
| Novolak prepared in (1) | 10.4 parts |
| Illustrated compound (I-3) | 1.3 parts |
| Quinonediazide compound prepared in (2) | 1.7 parts |
| Propylene glycol monomethyl ether acetate | 76.6 parts |
| Dimethylformamide | 10.0 parts |
| Surfactant "Troysol" 366 (produced by Troy Chemical) | 0.03 part |

(4) Preparation of developer

Two hundred and sixty eight cubic centimeters (0.268 mol) of 1N sodium hydroxide and 10.6 g (0.171 mol) of boric acid were dissolved into water, to make a total amount of 1 kg, and furthermore 0.05 g of "Surfinol" 104 (surfactant prepared by Nisshin Kagaku) was added.

(5) Resist process

The resist prepared in (3) was applied onto a silicon wafer using a spinner, and baked in a 110° C. oven for 10 minutes, to prepare a 0.5 μm thick film sample.

An electron beam exposure apparatus was used to expose the sample to a 0.45 mm×0.60 mm rectangular region at an acceleration voltage of 20 kV at a current of 1 nA sequentially with the exposure time changed.

Subsequently the developer prepared in (4) was used for immersion development at 23° C. for 200 seconds, and the developed sample was rinsed by pure water.

(6) Evaluation of properties

The resist film thicknesses of the non-exposed portion and the exposed rectangular regions of the sample were measured one after another. For each exposed portion, the dosage (the value obtained by dividing the product of current and exposure time by the area) and the film remaining rate (the value obtained by dividing the film thickness of the exposed portion by the coating film thickness) were calculated, and the film remaining rates were plotted against the logarithms of the dosage, to draw a sensitivity curve. From the sensitivity curve, the dosage corresponding to a film remaining rate of 0 was obtained as the sensitivity value. The coating fi-tm thickness was subtracted from the film thickness of the non-exposed portion, to obtain the film thickness loss.

The sensitivity was 4.0 μC/cm$^2$ and the film decrement was 0.099 μm.

COMPARATIVE EXAMPLE 1

(1) Preparation of resist composition

The following raw materials were mixed, to prepare a resist solution.

| | |
|---|---|
| The same novolak as used in Example 1 | 11.7 parts |
| The same quinonediazide compounds as used in Example 1 | 1.7 part |
| Propylene glycol monomethyl ether acetate | 76.6 parts |
| Dimethylformamide | 10.0 parts |
| Surfactant "Troysol" 366 (produced by Troy Chemical) | 0.03 part |

(2) Resist process and evaluation

A coating film sample was prepared and exposed as done in Example 1, and the same developer as used in Example 1 was used for immersion development for 140 seconds. The properties were evaluated as done in Example 1.

The sensitivity was 15.0 $\mu C/cm^2$ and the film thickness loss was 0.102 μm.

COMPARATIVE EXAMPLE 2

(1) Preparation of resist composition

The following raw materials were mixed, to prepare a resist solution.

| | |
|---|---|
| The same novolak as used in Example 1 | 10.4 parts |
| p-cresol trimer | 1.3 parts |
| The same quinonediazide compound as used in Example 1 | 1.7 parts |
| Propylene glycol monomethyl ether acetate | 76.6 parts |
| Dimethylformamide | 10.0 parts |
| Surfactant "Troysol" 366 (produced by Troy Chemical) | 0.03 part |

(2) Resist process and evaluation

A coating film sample was prepared and exposed as done in Example 1, and the same developer-as used in Example 1 was used for immersion development for 114 seconds. The properties were evaluated as done in Example 1.

The sensitivity was 8.0 $\mu C/cm^2$ and the film decrement was 0.101 μm.

COMPARATIVE EXAMPLE 3

(1) Preparation of resist composition

The following raw materials were mixed, to prepare a resist solution.

| | |
|---|---|
| The same novolak as used in Example 1 | 10.4 parts |
| 2,3,4-trihydroxybenzophenone | 1.3 parts |
| The same quinonediazide compound as used in Example 1 | 1.7 parts |
| Propylene glycol monomethyl ether acetate | 76.6 parts |
| Dimethylformamide | 10.0 parts |
| Surfactant "Troysol" 366 (produced by Troy Chemical) | 0.03 part |

(2) Resist process and evaluation

A coating film sample was prepared and exposed as done in Example 1, and the same developer as used in Example 1 was used for immersion development for 114 seconds. The properties were evaluated as doe in Example 1.

The sensitivity was 9.0 $\mu C/cm^2$ and the film thickness loss was 0.099 μm.

EXAMPLE 2

The same resist as used in Example 1 was used, and film coating and exposure were effected under the same conditions. The sample was immersed in an aqueous solution containing 0.13 mole of potassium silicate per 1 kg for development for 103 seconds, and the properties were evaluated as done in Example 1.

The sensitivity was 7.0 $\mu C/cm^2$ and the film thickness loss was 0.093 μm.

EXAMPLE 3

The same resist as used in Example 1 was used, and film coating and exposure were effected under the same conditions. The sample was immersed in an aqueous solution containing 0.213 mole of potassium silicate and 0.107 mole of tripotassium phosphate per 1 kg for development for 110 seconds, and the properties were evaluated as done in Example 1.

The sensitivity was 8.0 $\mu C/cm^2$ and the film thickness loss was 1.050 μm.

EXAMPLE 4

The same resist as used in Example 1 was used, and film coating and exposure were effected under the same conditions. The sample was immersed in 0.14N potassium hydroxide aqueous solution for development for 96 seconds, and the properties were evaluated as done in Example 1.

The sensitivity was 13 $\mu C/cm^2$ and the film decrement was 0.090 μm.

EXAMPLE 5

(1) Preparation of resist composition

The following raw materials were mixed, to prepare a resist solution.

| | |
|---|---|
| The same novolak as used in Example 1 | 10.4 parts |
| Illustrated compound (I-6) | 1.3 parts |
| The same quinonediazide compound as used in Example 1 | 1.7 parts |
| Propylene glycol monomethyl ether acetate | 76.6 parts |
| Dimethylformamide | 10.0 parts |
| Surfactant "Troysol" 366 (produced by Troy Chemical) | 0.03 part |

(3) Resist process and evaluation

A coating film sample was prepared and exposed as done in Example 1, and the same developer as used in Example 1 was used for immersion development for 180 seconds. The properties were evaluated as done in Example 1.

The sensitivity was 4.5 $\mu C/cm^2$ and the film thickness loss was 0.098 μm.

EXAMPLE 6

(1) Preparation of resist composition

The following raw materials were mixed, to prepare a resist solution.

| | |
|---|---|
| The same novolak as used in Example 1 | 10.4 parts |
| Illustrated compound (II-6) | 1.3 parts |
| The same quinonediazide compound as used in Example 1 | 1.7 parts |
| Propylene glycol monomethyl ether acetate | 76.6 parts |
| Dimethylformamide | 10.0 parts |
| Surfactant "Troysol" 366 (produced by Troy Chemical) | 0.03 part |

(2) Resist process and evaluation

A coating film sample was prepared and exposed as done in Example 1, and the same developer as used in Example 1 was used for immersed development for 120 seconds. The properties were evaluated as done in Example 1.

The sensitivity was 5.0 µC/cm² and the film thickness loss was 0.103 µm.

EXAMPLE 7

(1) Preparation of resist solution

The following raw materials were mixed, to prepare a resist solution.

| | |
|---|---|
| The same novolak as used in Example 1 | 10.4 parts |
| Illustrated compound (II-8) | 1.3 parts |
| The same quinonediazide compound as used in Example 1 | 1.7 parts |
| Propylene glycol monomethyl ether acetate | 76.6 parts |
| Dimethylformamide | 10.0 parts |
| Surfactant "Troysol" (produced by Troy Chemical) | 0.03 part |

(2) Resist process and evaluation

A coating film sample was prepared and exposed as done in Example 1, and the same developer as used in Example 1 was used for immersed development for 150 seconds. The properties were evaluated as done in Example 1.

The sensitivity was 5.0 µC/cm² and the film thickness loss was 0.100 µm.

EXAMPLE 8

The same resist as used in Example 1 was used, and film coating and exposure were effected under the same conditions. The sample was immersed in 1 kg of a developer prepared by dissolving 196 cc (0.196 mol) of 1N potassium hydroxide, 7.0 g (0.113 mol) of boric acid and 30.0 g (3.0 wt %) of 2-diethylaminoethanol into water, for development at 23° C. for 300 seconds, and the developed sample was rinsed by pure water. The properties were evaluated as done in Example 1.

The sensitivity was 4.6 µC/cm² and the film decrement was 0.093 µm.

By SEM, 0.5 µm line/space patterns could be observed to keep almost rectangles in an excellent form of 1:1. The development residue was not observed, and uniform resist patterns could be obtained.

EXAMPLE 9

The same resist as used in Example 1 was used, and film coating and exposure were effected under the same conditions. The sample was immersed into a developer prepared by dissolving 236 cc (0.236 mol) of 1N potassium hydroxide, 8.4 g (0.135 mol) of boric acid and 20.0 g.(2.0 wt %) of 2-diethylaminoethanol into water, to make a total amount of 1 kg, for development at 23° C. for 300 seconds, and the developed sample was rinsed by pure water. The properties were evaluated as done in Example 1.

The sensitivity was 4.5 µC/cm² and the film decrement was 0.140 µm.

By SEM, 0.5 µm line/space patterns could be observed to keep almost rectangles in an excellent-form of 1:1. The development residue was not observed, and uniform resist patterns could be obtained.

EXAMPLE 10

The same resist as used in Example 6 was used, and film coating and exposure were effected under the same conditions. The sample was immersed in a developer prepared by dissolving 196 cc (0.196 mol) of 1N potassium hydroxide, 7.0 g (0.113 mol) of boric acid and 30.0 g (3.0 wt %) of 2-diethylaminoethanol into water, to make a total amount of 1 kg, for development at 23° C. for 300 seconds, and the developed sample was rinsed by pure water. The properties were evaluated as done in Example 1.

The sensitivity was 4.3 µC/cm² and the film thickness loss was 0.103 µm.

By SEM, 0.5 µm line/space patterns could be observed to keep almost rectangles in an excellent form of 1:1. The development residue was not observed, and uniform resist patterns could be obtained.

INDUSTRIAL APPLICABILITY

The positive electron beam resist composition and the developer for the positive electron beam resist of the present invention can be used for producing masks for photolithography, semiconductor integrated circuits, etc. by using electron beam lithography.

We claim:

1. A positive electron beam resist composition, comprising (1) a cresolnovolak resin, (2) at least one additive selected from the group consisting of compounds represented by the following general formulae (I) and (II):

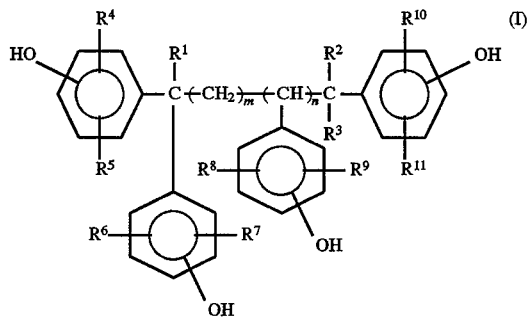

wherein $R^1$, $R^2$ and $R^3$ are each selected from the group consisting of hydrogen, an alkyl group, an aralkyl group and an aryl group; $R^4$, $R^5$, $R^6$, $R^7$, $R^8$, $R^9$, $R^{10}$ and $R^{11}$ are each selected from the group consisting of hydrogen, a halogen, a hydroxyl group and an alkyl group; m is an integer from 0 to 3; and n is an integer from 0 to 1

wherein X is

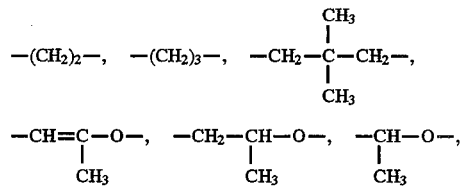

—CH$_2$—O—, 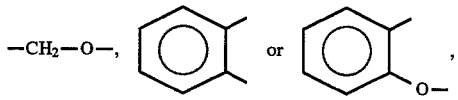

and R is an alkyl group or aralkyl group and (3) an electron beam sensitive quinonediazide compound obtained by reacting methyl gallate and 1,2-naphthoquinonediazido-4-sulfonyl chloride with each other, as main ingredients, where the amount of the additive (2) is 5 to 20 wt % based on the weight of the resist solid; the amount of the quinonediazide compound (3) is 10 to 20 wt % based on the weight of the resist solid; and the triester content in said electron beam sensitive quinonediazide compound (3) is 30 to less than 55 wt % based on the weight of said electron beam sensitive quinonediazide compound.

2. A positive electron beam resist composition, according to claim 1, wherein said additive (2) is a compound represented by general formula (I) where m is 0 or 1.

3. A positive electron beam resist composition, according to claim 1, wherein said additive (2) is a compound represented by general formula (I) where m is 0 and n is 0.

4. A positive electron beam resist composition, according to claim 1, wherein said additive (2) is a compound represented by general formula (I) where $R^4$ to $R^{11}$ each represent a halogen atom or an alkyl group.

5. A positive electron beam resist composition, according to claim 4, wherein said additive (2) is a compound represented by general formula (I) where $R^4$ to $R^{11}$ each represent a chlorine atom or a methyl group.

6. A positive electron beam resist composition, according to claim 1, wherein said additive (2) is a compound represented by general formula (I) where each of the OH groups are at the p-position.

7. A positive electron beam resist composition, according to claim 1, wherein said additive (2) is contained in an amount of 10 to 20 wt % based on the weight of the resist solid.

8. A positive electron beam resist composition, according to claim 1, wherein said electron beam sensitive quinonediazide compound (3) is contained in an amount of 15 to 20 wt % based on the weight of the resist solid.

9. A positive electron beam resist composition, according to claim 1, wherein the triester content in the electron beam sensitive quinonediazide compound (3) is 40 to 50 wt %.

* * * * *